US009467785B2

(12) United States Patent
Conklin

(10) Patent No.: US 9,467,785 B2
(45) Date of Patent: Oct. 11, 2016

(54) MEMS APPARATUS WITH INCREASED BACK VOLUME

(71) Applicant: Knowles Electronics, LLC, Itasca, IL (US)

(72) Inventor: Wade Conklin, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/220,664

(22) Filed: Mar. 20, 2014

(65) Prior Publication Data

US 2014/0291784 A1    Oct. 2, 2014

Related U.S. Application Data

(60) Provisional application No. 61/805,993, filed on Mar. 28, 2013.

(51) Int. Cl.
| | | |
|---|---|---|
| H04R 19/04 | (2006.01) | |
| H04R 19/00 | (2006.01) | |
| H04R 1/28 | (2006.01) | |
| H04R 1/04 | (2006.01) | |

(52) U.S. Cl.
CPC ............ *H04R 19/04* (2013.01); *H04R 1/2807* (2013.01); *H04R 19/005* (2013.01); *H04R 1/04* (2013.01); *H04R 2201/003* (2013.01)

(58) Field of Classification Search
CPC .... B81B 7/0061; B81B 7/008; H04R 19/005
See application file for complete search history.

(56) References Cited

U.S. PATENT DOCUMENTS

| | | | |
|---|---|---|---|
| 5,740,261 | A | 4/1998 | Loeppert |
| 5,822,598 | A | 10/1998 | Lam |
| 6,070,140 | A | 5/2000 | Tran |
| 6,154,721 | A | 11/2000 | Sonnic |
| 6,249,757 | B1 | 6/2001 | Cason |
| 6,397,186 | B1 | 5/2002 | Bush et al. |
| 6,552,469 | B1 | 4/2003 | Pederson |
| 6,756,700 | B2 | 6/2004 | Zeng |
| 6,781,231 | B2 | 8/2004 | Minervini |
| 7,166,910 | B2 * | 1/2007 | Minervini ..................... 257/704 |
| 7,190,038 | B2 | 3/2007 | Dehe et al. |
| 7,242,089 | B2 | 7/2007 | Minervini |
| 7,382,048 | B2 | 6/2008 | Minervini |
| 7,415,416 | B2 | 8/2008 | Rees |
| 7,439,616 | B2 | 10/2008 | Minervini |
| 7,473,572 | B2 | 1/2009 | Dehe et al. |

(Continued)

FOREIGN PATENT DOCUMENTS

| | | |
|---|---|---|
| DE | 112010006098 | 3/2014 |
| EP | 1346601 | 5/2011 |

(Continued)

OTHER PUBLICATIONS

International Search Report and Written Opinion for PCT/US2014/031432, dated Jun. 27, 2014, 9 pages.

*Primary Examiner* — William Coleman
(74) *Attorney, Agent, or Firm* — Foley & Lardner LLP

(57) ABSTRACT

A microelectromechanical system (MEMS) microphone assembly includes a base and a cover. The cover is coupled to the base and together with the base defines a cavity. The base forms a recess and the recess has dimensions and a shape so as to hold a MEMS die. The MEMS die includes a diaphragm and back plate.

6 Claims, 5 Drawing Sheets

(56) References Cited

U.S. PATENT DOCUMENTS

| | | |
|---|---|---|
| 7,501,703 B2 | 3/2009 | Minervini |
| 7,633,156 B2 | 12/2009 | Minervini |
| 7,774,204 B2 | 8/2010 | Mozer et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 7,957,972 B2 | 6/2011 | Huang et al. |
| 8,018,049 B2 | 9/2011 | Minervini |
| 8,121,331 B2 | 2/2012 | Minervini |
| 8,170,244 B2 | 5/2012 | Ryan |
| 8,275,148 B2 | 9/2012 | Li et al. |
| 8,358,004 B2 | 1/2013 | Minervini |
| 8,450,817 B2 | 5/2013 | Minervini |
| 8,526,665 B2 | 9/2013 | Lutz |
| 8,594,347 B2 | 11/2013 | Ryan |
| 8,624,384 B1 | 1/2014 | Minervini |
| 8,624,385 B1 | 1/2014 | Minervini |
| 8,624,386 B1 | 1/2014 | Minervini |
| 8,624,387 B1 | 1/2014 | Minervini |
| 8,629,551 B1 | 1/2014 | Minervini |
| 8,629,552 B1 | 1/2014 | Minervini |
| 8,666,751 B2 | 3/2014 | Murthi et al. |
| 8,704,360 B1 | 4/2014 | Minervini |
| 8,781,140 B2 | 7/2014 | Lautenschlager |
| 8,791,531 B2 | 7/2014 | Loeppert |
| 8,879,767 B2 | 11/2014 | Wickstrom |
| 8,969,980 B2 | 3/2015 | Lee |
| 8,972,252 B2 | 3/2015 | Hung et al. |
| 8,983,105 B2 | 3/2015 | Reining |
| 8,995,694 B2 | 3/2015 | Vos |
| 8,996,381 B2 | 3/2015 | Mozer et al. |
| 9,006,880 B1 | 4/2015 | Minervini |
| 9,023,689 B1 | 5/2015 | Minervini |
| 9,024,432 B1 | 5/2015 | Minervini |
| 9,043,211 B2 | 5/2015 | Haiut et al. |
| 9,051,171 B1 | 6/2015 | Minervini |
| 9,078,063 B2 | 7/2015 | Loeppert |
| 9,112,984 B2 | 8/2015 | Sejnoha et al. |
| 9,137,595 B2 | 9/2015 | Lee |
| 9,139,421 B1 | 9/2015 | Minervini |
| 9,139,422 B1 | 9/2015 | Minervini |
| 9,148,731 B1 | 9/2015 | Minervini |
| 2005/0207605 A1 | 9/2005 | Dehe et al. |
| 2006/0074658 A1 | 4/2006 | Chadha |
| 2006/0194364 A1 | 8/2006 | Bouche et al. |
| 2007/0215962 A1 | 9/2007 | Minervini |
| 2007/0278501 A1 | 12/2007 | MacPherson et al. |
| 2008/0175425 A1 | 7/2008 | Roberts et al. |
| 2008/0217709 A1 | 9/2008 | Minervini |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0042762 A1* | 2/2011 | Laming et al. ............... 257/416 |
| 2011/0075875 A1 | 3/2011 | Wu et al. |
| 2012/0039499 A1 | 2/2012 | Ryan |
| 2012/0161255 A1 | 6/2012 | Gabert et al. |
| 2012/0232896 A1 | 9/2012 | Taleb et al. |
| 2012/0310641 A1 | 12/2012 | Niemisto et al. |
| 2013/0032936 A1* | 2/2013 | Formosa ...................... 257/704 |
| 2013/0108074 A1 | 5/2013 | Reining |
| 2013/0177192 A1 | 7/2013 | Abry |
| 2013/0223635 A1 | 8/2013 | Singer et al. |
| 2014/0037115 A1 | 2/2014 | Vos |
| 2014/0037120 A1 | 2/2014 | Lim |
| 2014/0037124 A1 | 2/2014 | Lim |
| 2014/0064546 A1 | 3/2014 | Szczech |
| 2014/0122078 A1 | 5/2014 | Joshi et al. |
| 2014/0133686 A1 | 5/2014 | Lee |
| 2014/0163978 A1 | 6/2014 | Basye et al. |
| 2014/0244269 A1 | 8/2014 | Tokutake |
| 2014/0257821 A1 | 9/2014 | Adams et al. |
| 2014/0274203 A1 | 9/2014 | Ganong et al. |
| 2014/0278435 A1 | 9/2014 | Ganong et al. |
| 2014/0281628 A1 | 9/2014 | Nigam et al. |
| 2014/0291783 A1 | 10/2014 | Talag |
| 2014/0294209 A1 | 10/2014 | Szczech |
| 2014/0321687 A1 | 10/2014 | Friel |
| 2014/0343949 A1 | 11/2014 | Huang et al. |
| 2015/0041931 A1 | 2/2015 | Szczech |
| 2015/0106085 A1 | 4/2015 | Lindahl |
| 2015/0112690 A1 | 4/2015 | Guha et al. |
| 2015/0117681 A1 | 4/2015 | Watson |
| 2015/0134331 A1 | 5/2015 | Millet et al. |
| 2015/0139428 A1 | 5/2015 | Reining |
| 2015/0172825 A1 | 6/2015 | Lim |
| 2015/0195659 A1 | 7/2015 | Szczech |
| 2015/0208165 A1 | 7/2015 | Volk |
| 2015/0251898 A1 | 9/2015 | Vos |

FOREIGN PATENT DOCUMENTS

| | | |
|---|---|---|
| JP | 2009088568 A | 4/2009 |
| KR | 200448302 Y1 | 3/2010 |
| WO | 2007007929 A1 | 1/2007 |

\* cited by examiner

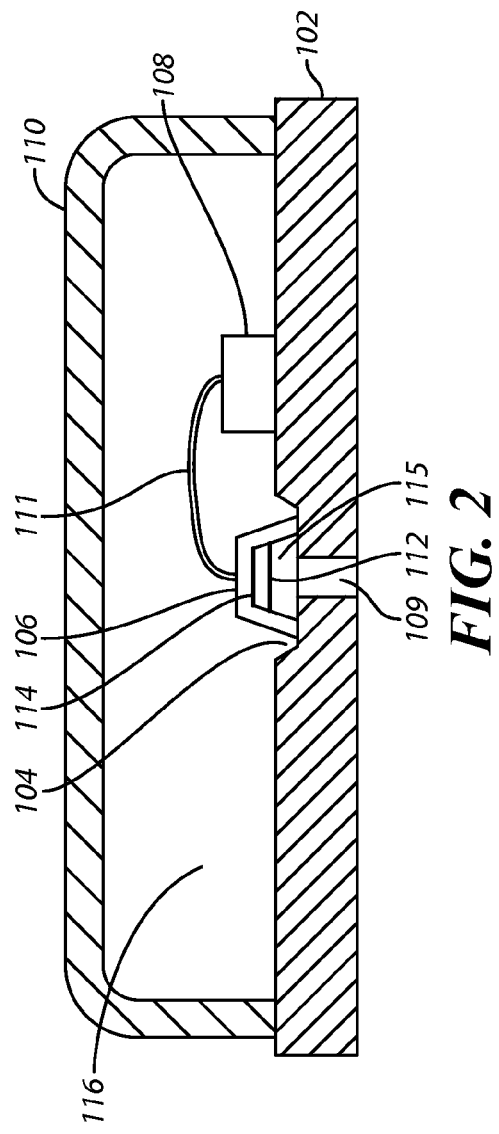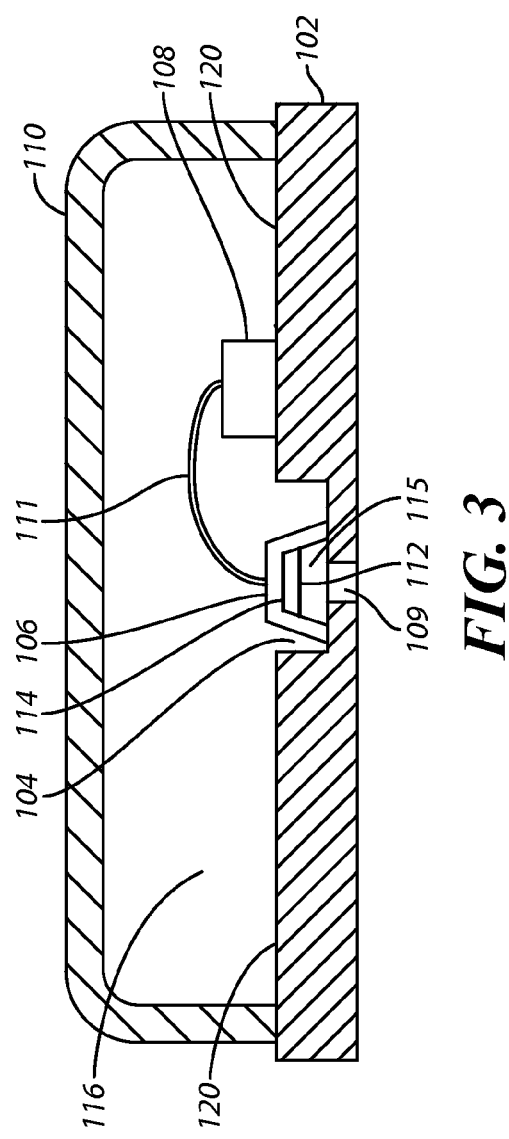

MEMS APPARATUS WITH INCREASED BACK VOLUME

CROSS REFERENCE TO RELATED APPLICATIONS

This patent claims benefit under 35 U.S.C. §119 (e) to U.S. Provisional Application No. 61805993 entitled "MEMS Apparatus with Increased Back Volume" filed Mar. 28, 2013, the content of which is incorporated herein by reference in its entirety.

TECHNICAL FIELD

This application relates to MicroElectroMechanical System (MEMS) devices and, more specifically, to MEMS microphones with improved performance characteristics.

BACKGROUND OF THE INVENTION

MicroElectroMechanical System (MEMS) devices include microphones and speakers to mention two examples. In the case of a MEMS microphone, sound energy enters through a sound port and vibrates a diaphragm and this action creates a corresponding change in electrical potential (voltage) between the diaphragm and a back plate disposed near the diaphragm. This voltage represents the sound energy that has been received. Typically, the voltage is then transmitted to an integrated circuit (e.g., such as an application specific integrated circuit (ASIC)). Further processing of the signal may be performed on the integrated circuit. For instance, amplification or filtering functions may be performed at the voltage signal at the integrated circuit. MEMS microphones can be used with various customer electronic devices such as those associated with cellular phones or personal computers to mention two examples.

It is typically desired to have the microphone have as great a sensitivity as possible. The greater the sensitivity, the better the performance of the microphone. As is well known, the back volume affects the sensitivity and, generally speaking, the greater the back volume, the greater the sensitivity of the microphone.

As mentioned, MEMS microphones typically have a MEMS device and an integrated circuit (e.g., an application specific integrated circuit (ASIC)) disposed in an assembly. These components, although needed for operation of the microphone, also take up back volume and therefore to some extent limit the amount of sensitivity that can be provided for a particular MEMS device.

Because of these shortcomings, previous approaches have not adequately addressed the above-mentioned problems and user dissatisfaction with these previous approaches has increased.

BRIEF DESCRIPTION OF THE DRAWINGS

For a more complete understanding of the disclosure, reference should be made to the following detailed description and accompanying drawings wherein:

FIG. 2 is a side cut-away view of a microphone assembly 1 with a ceramic substrate with a recess in the substrate along line A-A of FIG. 1 according to various embodiments of the present invention;

FIG. 3 is a side cut-away view of a microphone assembly with a ceramic substrate with a recess in the substrate along line A-A of FIG. 1 according to various embodiments of the present invention;

Figure 1:
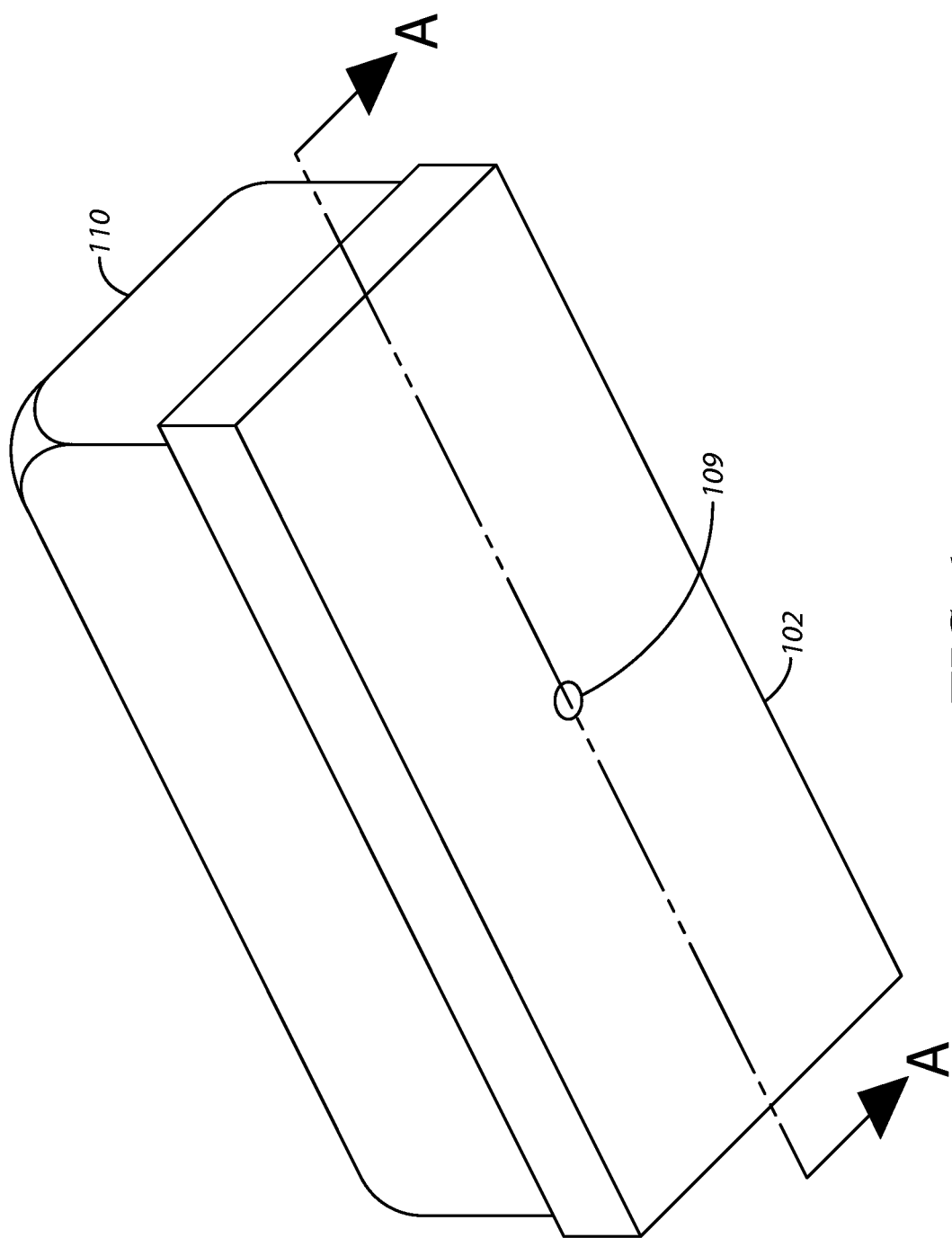
FIG. 1 comprises a perspective view of a microphone assembly according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

MicroElectroMechanical System (MEMS) devices (e.g., MEMS microphones) are provided that have increased back volumes, and therefore improved performances as compared to previous MEMS devices. In one aspect, a recess is created in a substrate of a bottom port MEMS microphone. A MEMS device is disposed in the substrate. Disposing the MEMS device in the recess in the substrate increases the back volume of the MEMS microphone. Increasing the back volume improves the performance characteristics of the MEMS microphone. For example, an increased sensitivity is achieved. By "sensitivity" and as used herein, it is meant the transduction efficiency of the MEMS microphone. For a capacitive sensing MEMS microphone, this would be the electric potential per unit pressure. It will be understood that in the examples described herein a MEMS device is disposed in the recess. Alternatively, a MEMS device plus an integrated circuit (e.g., an application specific integrated circuit (ASIC)) can be disposed in the recess. Further, only the integrated circuit (e.g., an ASIC) may be disposed in the recess. Still further, any component on the substrate (e.g., a printed circuit board (PCB)) can be disposed in the recess together with the MEMS device or by itself to increase the back volume.

Referring now to FIG. 1, FIG. 2, FIG. 3, and FIG. 4 an example MEMS device (e.g., a MEMS microphone) having a ceramic substrate is described. Each of these examples includes a substrate 102, a recess 104 disposed in the substrate 102, a MEMS device 106 in the recess 104, an integrated circuit 108, and wire bonds 111 (between the MEMS device 106 and the integrated circuit 108). A lid or cover 110 covers the MEMS device 106 and the integrated circuit 108, and attaches to the substrate 102. A port 109 extends through the substrate 102.

The MEMS device 106 includes a diagram 112 and a back plate 114. A back volume 116 is formed between the lid 110 and the substrate 102. A front volume 115 is formed in the port 109. Pads (not shown) on the bottom of the substrate may communicate with the integrated circuit 108 using conductive vias (not shown). The pads may also couple to customer electronic devices such as those used in personal computers or cellular phones. Other examples of customer electronic devices are possible.

In each of the examples of FIG. 1, FIG. 2, and FIG. 3, the recess 104 is of a different depth. In FIG. 2, the recess 104 is shallow, for example, 25 microns in depth. In FIG. 3, the recess is deeper (e.g., 250 microns in depth) and the top of the MEMS device 106 is approximately flush with a surface 120 of the substrate 102.

The recesses described herein generally are box shaped having a flat bottom surface. However, it will be appreciated that the recesses may assume other shapes and configurations as well.

Figure 4:
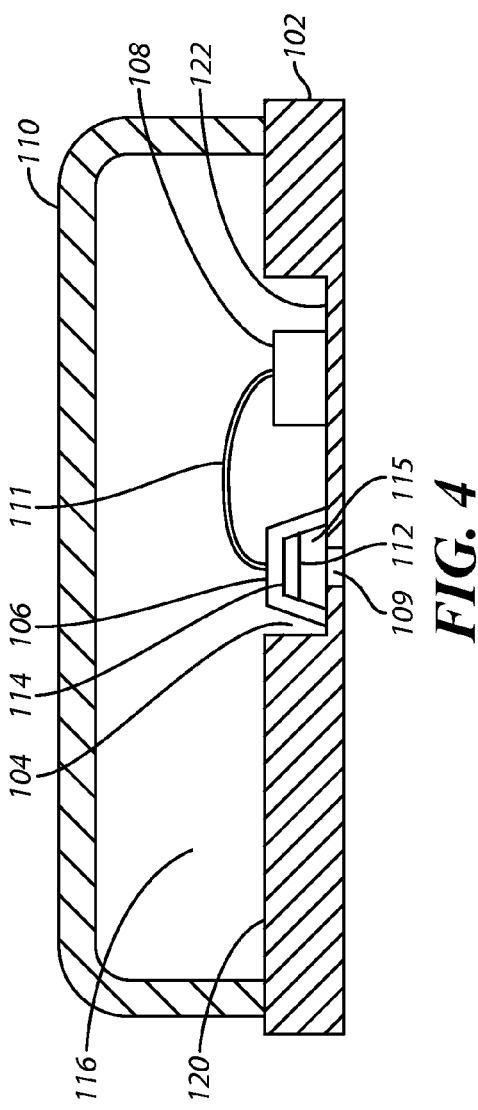
FIG. 4 is side cut-away view of a microphone assembly with a ceramic substrate with a recess in the substrate along line A-A of FIG. 1 according to various embodiments of the present invention.

In the example of FIG. 4, the surface 120 is lower than the surface 122, but not low as the surface 124 creating a stepped substrate 102. The exact dimensions and depths of the recess 104 are selected according to factors such as how easily the bonds 110 can be attached. Other factors may also be considered and other configurations for the substrate 102 can also be used.

In one example of the operation of the MEMS microphone assembly 100, sound energy enters through the sound port 109 and vibrates the diaphragm 112 and this action creates a corresponding change in electrical potential (voltage) between the diaphragm 112 and the back plate 114 disposed near the diaphragm 112. This voltage represents the sound energy that has been received. Typically, the voltage is then transmitted to the integrated circuit 108. Further processing of the signal may be performed at the integrated circuit 108. For instance, amplification or filtering functions may be performed at the voltage signal at the integrated circuit 108.

Advantageously, the approaches described increase the back volume since, in part, the MEM device 104 is not taking up back volume space. This results increased sensitivity for the microphone.

It will be understood that in the examples described herein a MEMS device is disposed in the recess. Alternatively, a MEMS device plus an integrated circuit (e.g., an application specific integrated circuit (ASIC)) can be disposed in the recess. Further, only the integrated circuit (e.g., an ASIC) may be disposed in the recess. Still further, any component on the substrate (e.g., a printed circuit board (PCB)) can be disposed in the recess together with the MEMS device or by itself to increase the back volume.

Figure 5:
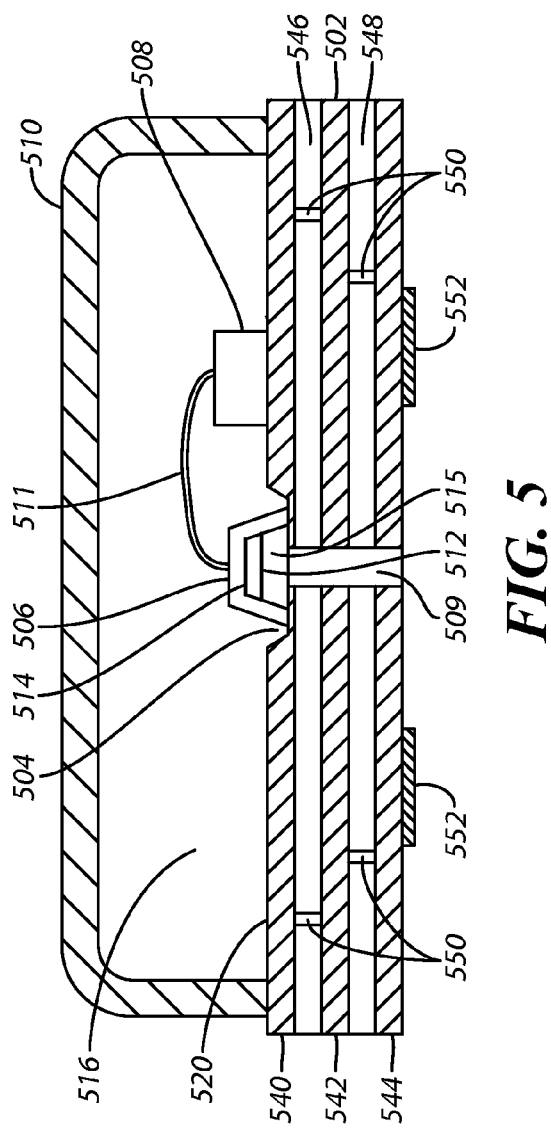
FIG. 5 is a side cut-away view of a microphone assembly with a layered printed circuit board as a substrate along line A-A of FIG. 1 according to various embodiments of the present invention.
Figure 6:
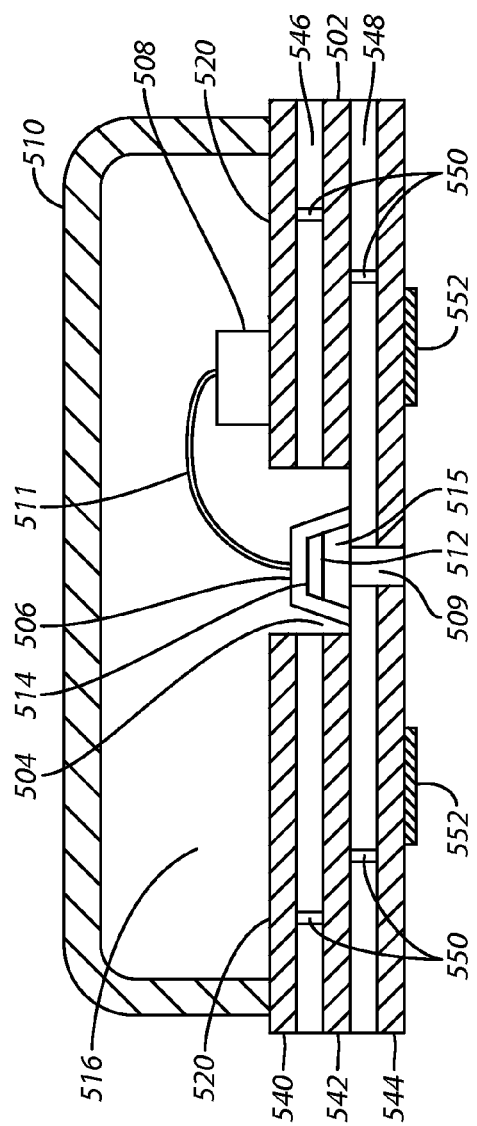
FIG. 6 is a side cut-away view of a microphone assembly with a layered printed circuit board as a substrate along line A-A of FIG. 1 according to various embodiments of the present invention.
Figure 7:
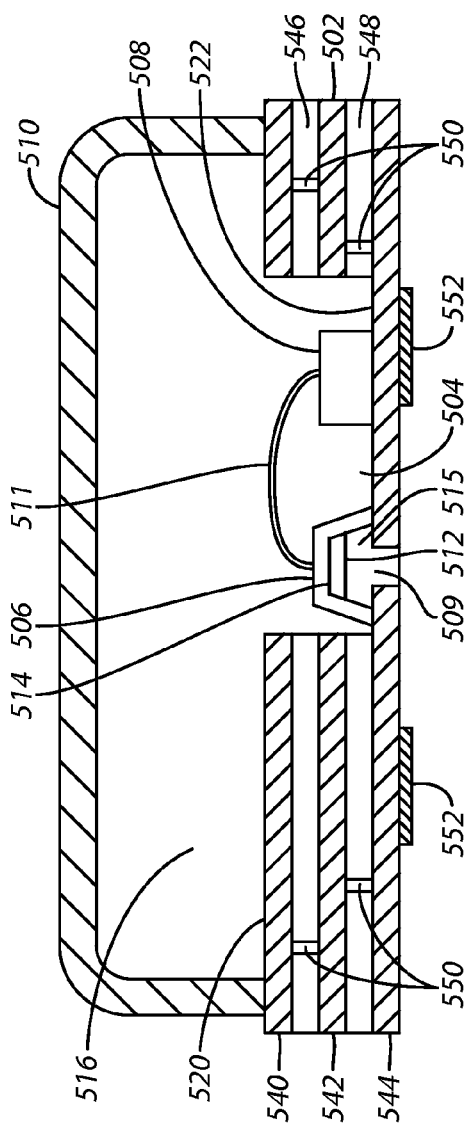
FIG. 7 is a side cut-away view of a microphone assembly with a layered printed circuit board as a substrate along line A-A of FIG. 1 according to various embodiments of the present invention.

Referring now to FIG. 1 (which is common to all examples described herein), FIG. 5, FIG. 6, and FIG. 7, examples of MEMS microphones with layered substrates are described. Each of these examples, includes a substrate 502, a recess 504 dispersed in the substrate 502, a MEMS device 506 disposed in the recess 504, an integrated circuit 508, wire bonds 511 (between the MEMS device 506 and the integrated circuit 508). A lid 510 covers the MEMS device 506 and the integrated circuit 508 and attaches to the substrate 502.

In FIG. 5, the recess 504 is shallow (e.g., 25 microns in depth). In FIG. 6, the recess 504 is deeper (e.g., 250 microns in depth) and the top of the MEMS device 506 is approximately flush with a surface 520 of the substrate 502. A port 509 extends through the substrate 502.

In the example of FIG. 7, the surface 520 is lower than the surface 522, but not low as the surface 524 creating a stepped substrate 502. The exact dimensions and depths of the recess are selected according to factors such as how easily the bonds 510 can be attached. Other factors can also be considered. Other configurations for the substrate 502 can also be used.

Advantageously, the approaches described increase the back volume since, in part, the MEM device 504 is not taking up back volume space. This results increase sensitivity for the microphone assembly 500.

The substrate 502 include a first metal layer 540, a second metal layer 542, a third metal layer 544, a first insulative layer 546, and a second insulative layer 548. Conduits 550 couple the metal layers together. Pads 552 couple the MEMS device 506 and integrated circuit 508 to the metal layers. Pads on the exterior of the device couple external customer electronic devices to the assembly 500. It will be appreciated that the exact dimensions, shape, and composition of each layer described above can vary.

In one example of the operation of the MEMS microphone assembly 500, sound energy enters through the sound port 509 and vibrates the diaphragm 512 and this action creates a corresponding change in electrical potential (voltage) between the diaphragm 512 and the back plate 514 disposed near the diaphragm 512. This voltage represents the sound energy that has been received. Typically, the voltage is then transmitted to the integrated circuit 508. Further processing of the signal may be performed at the integrated circuit 508. For instance, amplification or filtering functions may be performed at the voltage signal at the integrated circuit 508.

It will be understood that in the examples described herein a MEMS device is disposed in the recess. Alternatively, a MEMS device plus an integrated circuit (e.g., an application specific integrated circuit (ASIC)) can be disposed in the recess. Further, only the integrated circuit (e.g., an ASIC) may be disposed in the recess. Still further, any component on the substrate (e.g., a printed circuit board (PCB)) can be disposed in the recess together with the MEMS device or by itself to increase the back volume.

Figure 8:
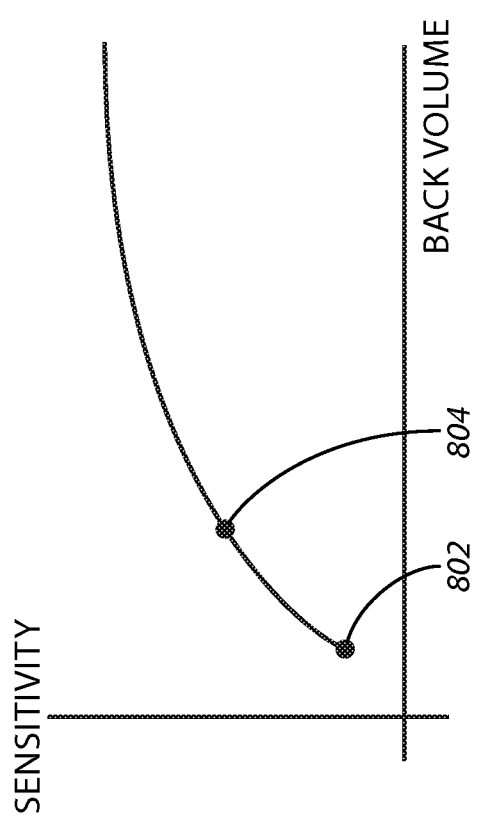
FIG. 8 is a graph showing the beneficial effects with regards to sensitivity by using the approaches described herein according to various embodiments of the present invention.

Referring now to FIG. 8, one example of the beneficial effects of the present approaches is described. The x-axis represents the back volume of a MEMS microphone while the y-axis represents sensitivity of the MEMS microphone. It can be seen that as the back volume increases, the sensitivity of the microphone also increases, yielding a device with improved performance characteristics. For example, at point 802 in the curve, the back volume is relatively small (e.g., 1.5 mm$^3$). As the back volume increases, for instance to a point 804, the sensitivity also increases to a larger volume. In one example, the back volume changes by approximately 2 or 2.5 mm$^3$ and the subsequent change in sensitivity is from approximately 0.5 to 2 dB.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A microelectromechanical system (MEMS) microphone assembly, comprising
    a cover having volume, a base, the base being coupled to the cover and together with the cover defining an interior cavity, the base including a top surface facing the interior cavity and a bottom surface extending over substantially all of the base, the bottom surface of the base being exposed to an exterior environment of the microphone;

wherein the base comprises a plurality of layers including at least one bottom layer having an exterior surface that forms the bottom surface of the base, and the base having an interior surface disposed in parallel to the exterior surface, the interior surface being at least partially exposed to the interior cavity;

wherein the base forms a recess extending from the top surface of the base to the interior surface of the bottom layer of the base, the recess having a horizontal dimension and a shape so as to hold a MEMS die, the MEMS die disposed on the interior surface of the bottom layer of the base and within the recess, the MEMS die including a diaphragm and back plate; and wherein the bottom layer forms a port opening extending from the exterior surface of the bottom layer to the interior surface of the bottom layer, the port opening having a port diameter, the port diameter being less than the horizontal dimension of the recess.

2. The MEMS microphone assembly of claim 1, further comprising an integrated circuit disposed at least partially within the recess, the integrated circuit electrically coupled to the MEMS die.

3. The MEMS microphone assembly of claim 1, wherein the base comprises a multi-layer printed circuit board.

4. The MEMS microphone assembly of claim 1 wherein the port opening communicates with portions of the MEMS die.

5. The MEMS microphone assembly of claim 1 wherein the MEMS die extends above the top surface and into the cavity.

6. The MEMS microphone assembly of claim 1, wherein the MEMS die extends below the top surface and into the cavity.

* * * * *